(12) United States Patent
Noble et al.

(10) Patent No.: US 10,461,801 B2
(45) Date of Patent: Oct. 29, 2019

(54) USING HARMONICS FOR FULFILLING MULTIPLE JOBS SIMULTANEOUSLY

(71) Applicant: Raytheon Company, Waltham, MA (US)

(72) Inventors: William B. Noble, Santa Monica, CA (US); Kevin Yang, Monrovia, CA (US); Christopher J. Behrens, Redondo Beach, CA (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 15/851,122

(22) Filed: Dec. 21, 2017

(65) Prior Publication Data

US 2019/0199393 A1    Jun. 27, 2019

(51) Int. Cl.
*H04B 1/66* (2006.01)
*H04B 14/08* (2006.01)

(52) U.S. Cl.
CPC ............... *H04B 1/66* (2013.01); *H04B 14/08* (2013.01)

(58) Field of Classification Search
CPC combination set(s) only.
See application file for complete search history.

(56) References Cited

U.S. PATENT DOCUMENTS 8,233,412 B1 * 7/2012 Abbey .................. H04B 1/001
                                                                370/210
2008/0253479 A1   10/2008 Davidow et al.

2012/0155344 A1   6/2012 Wiley et al.
2017/0033591 A1 * 2/2017 Govindaraj ............. H02J 7/042
2017/0366280 A1 * 12/2017 Gebhard ............... H03D 7/1441

FOREIGN PATENT DOCUMENTS

JP       2002-458790    *   4/2002
WO    WO-2014032198 A1    3/2014

OTHER PUBLICATIONS

"Active Electronically Scanned Array", Wikipedia, [Online]. Retrieved from the Internet: <URL: https://en.wikipedia.org/wiki/Active_electronically_scanned_array>, (Accessed Dec. 12, 2017), 9 pgs.
"Aircraft 101: Radar Fundamentals (Part II)", Word Press, [Online]. Retrieved from the Internet: <URL: https://basicsaboutaerodynamicsandavionics.wordpress.com/2016/08/11/radar-fundamentals-part-ii/ >, (Aug. 11, 2016), 62 pgs.
"Understanding AESA: A Game-Changer in RADAR Technology", Biley technologies Inc., [Online]. Retrieved from the Internet: <URL: http://blog.bliley.com/understanding-aesa-radar-tech>, (Sep. 12, 2017), 8 pgs.

(Continued)

*Primary Examiner* — Junpeng Chen
(74) *Attorney, Agent, or Firm* — Schwegman Lundberg & Woessner, P.A.

(57) ABSTRACT

A method can include determining whether, based on job data and in completing a first job of jobs with a transmission at a fundamental frequency, a harmonic frequency of the fundamental frequency satisfies a second job of the jobs, and transmitting the transmission with the fundamental frequency and the harmonic frequency to complete the first and second jobs, respectively and simultaneously.

18 Claims, 9 Drawing Sheets

(56) References Cited

OTHER PUBLICATIONS

Enomoto, Jun, et al., "Second Harmonic Treatment Technique for Bandwidth Enhancement of GaN HEMT Amplifier With Harmonic Reactive Terminations", IEEE Transactions on Microwave Theory and Techniques, vol. 65, No. 12, (Dec. 2017), 4947-4952.

Rubio, Jorge Moreno, et al., "3—3.6 GHz Wideband GaN Doherty Power Amplifier Exploiting Output Compensation Stages", IEEE Transactions on Microwave Theory and Techniques vol. 60, No. 8, (2012), 2543-2548.

Tonnaer, Annemieke, "Dual Axis Multi-beam radars", IEEE, (2013), 412-416.

Waldstein, Seth, et al., "Wideband Reconfigurable Harmonically Tuned GaN SSPA for Cognitive Radios", CCAA, [Online]. Retrieved from the Internet: <URL: http://ieee-ccaa.com/wp-content/uploads/2017/06/02_123.pdf>, (2017), 18 pgs.

"International Application Serial No. PCT/US2018/066793, International Search Report dated Feb. 28, 2019", 4 pgs.

"International Application Serial No. PCT/US2018/066793, Written Opinion dated Feb. 28, 2019", 7 pgs.

\* cited by examiner

USING HARMONICS FOR FULFILLING MULTIPLE JOBS SIMULTANEOUSLY

TECHNICAL FIELD

Embodiments discussed herein regard devices, systems, and methods for simultaneously completing a first job using a fundamental frequency and a second job using a harmonic frequency of the fundamental frequency.

BACKGROUND

Harmonics of a primary frequency are viewed as negative. Harmonics are seen as wasted energy, because they are not in the intended frequency range. The harmonics are often filtered out or systems are designed to avoid the harmonics, as the harmonics can provide negative effects. The negative effects can include interference with another component of a same system or another system. The negative effects can include increased heating in the apparatus producing the signal, spurious fuse or circuit breaker tripping, hysteresis loss in a core of a transformer, timing problems in regulators, incorrect readings in utility meters or other meters, failure of a commutation circuit of an alternating current (AC) or direct current (DC) drive of a power supply, or failure of an electronic device.

BRIEF DESCRIPTION OF THE DRAWINGS

In the drawings, which are not necessarily drawn to scale, like numerals can describe similar components in different views. Like numerals having different letter suffixes can represent different instances of similar components. The drawings illustrate generally, by way of example, but not by way of limitation, various embodiments or examples discussed in the present document.

DETAILED DESCRIPTION

Embodiments generally relate to simultaneously completing a first job using a fundamental frequency of a transmission (e.g., an electromagnetic, acoustic, mechanical, or the like) and a second job using a harmonic frequency of the fundamental frequency of the electromagnetic transmission.

Figure 1:
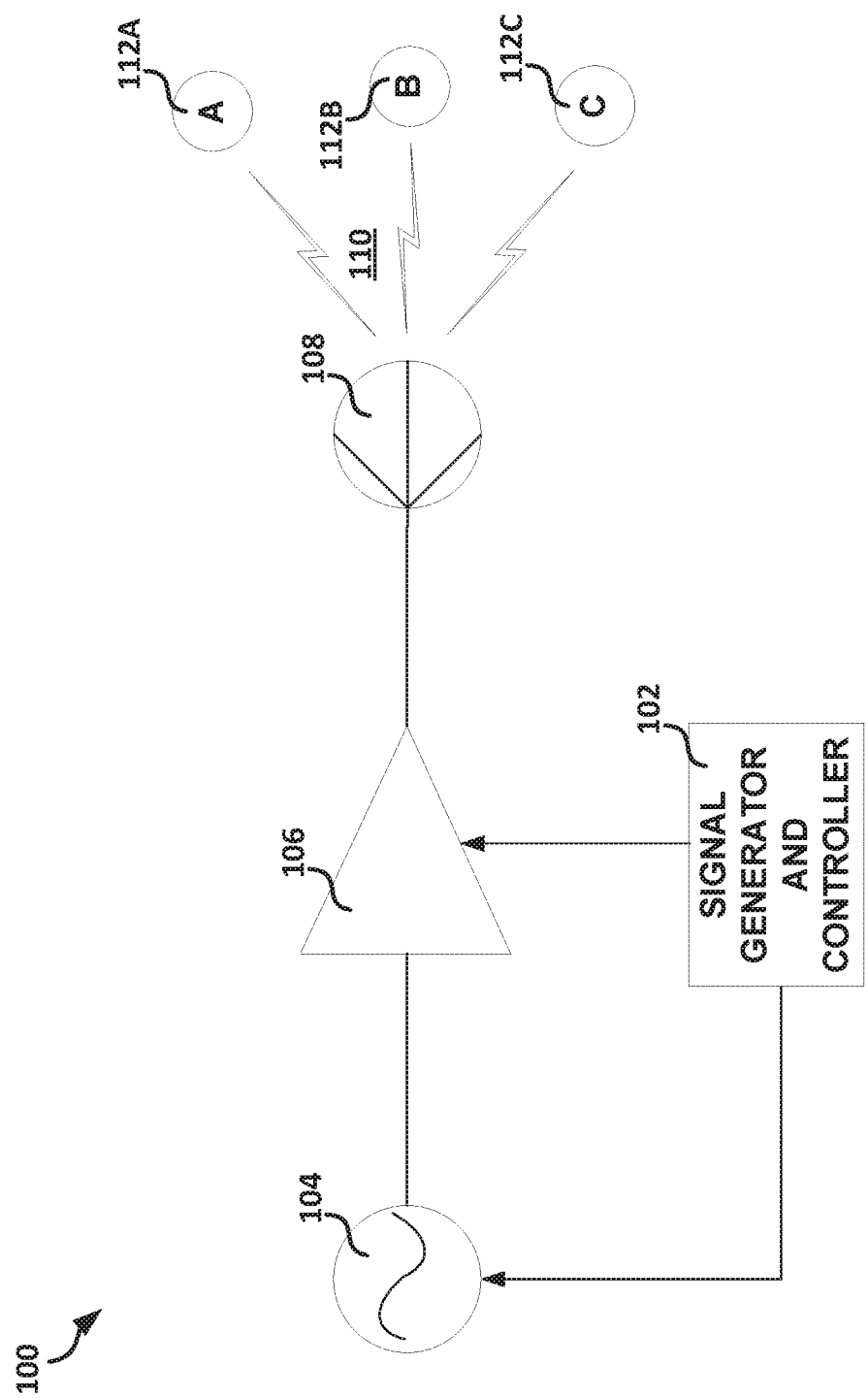
FIG. 1 illustrates, by way of example, a diagram of an embodiment of a system to generate, amplify, control, and transmit information or energy to one or more receiving nodes.

FIG. 1 illustrates, by way of example, a diagram of an embodiment of a system 100 to generate, amplify, control, and transmit information or energy to a single or multiple receiving nodes over a communications medium 110. The system 100 as illustrated includes a signal generator and controller 102, an exciter 104, an amplifier 106, a transducer 108, a communications medium 110, and receiving nodes 112. While the signal generator and controller 102 are illustrated and described as a single component, the signal generator and controller 102 can be separate components.

A signal containing information can be generated by the signal generator and controller 102 and provided to the exciter 104. The exciter 104 modulates a carrier signal to allow for propagation over the communications medium 110. Modulating the information by the exciter 104 can include mechanical, electrical or optical excitation, or the like.

The amplifier 106 can receive the modulated signal from the exciter 104 and produce an amplified version of the modulated signal. The amplified signal can include harmonics and noise as described in FIG. 2. The amplified signal can be transduced by the transducer 108 for propagation in the communication medium 110.

The signal generator and controller 102 can be control the exciter 104, the amplifier 106, or transducer 108 based on the amplified signal characteristics, such as to improve transmission of a signal to a receiving node 112A, 112B, or 112C. Improvement of transmission can include reduced error rate, increased bandwidth, increased signal power, and increase in the number of receiving nodes for which information is received.

The communications medium 110 can include free space, electrical cable, water, optical cable, or other medium. The receiving node 112A-112C can include cooperative participants in a communication system or non-cooperative participants in a system. The receiving node 112A-112C can communicate using RF energy or be affected, whether positively or adversely, by RF energy. The receiving node 112A-112C can include a compute or other device.

Figure 2:
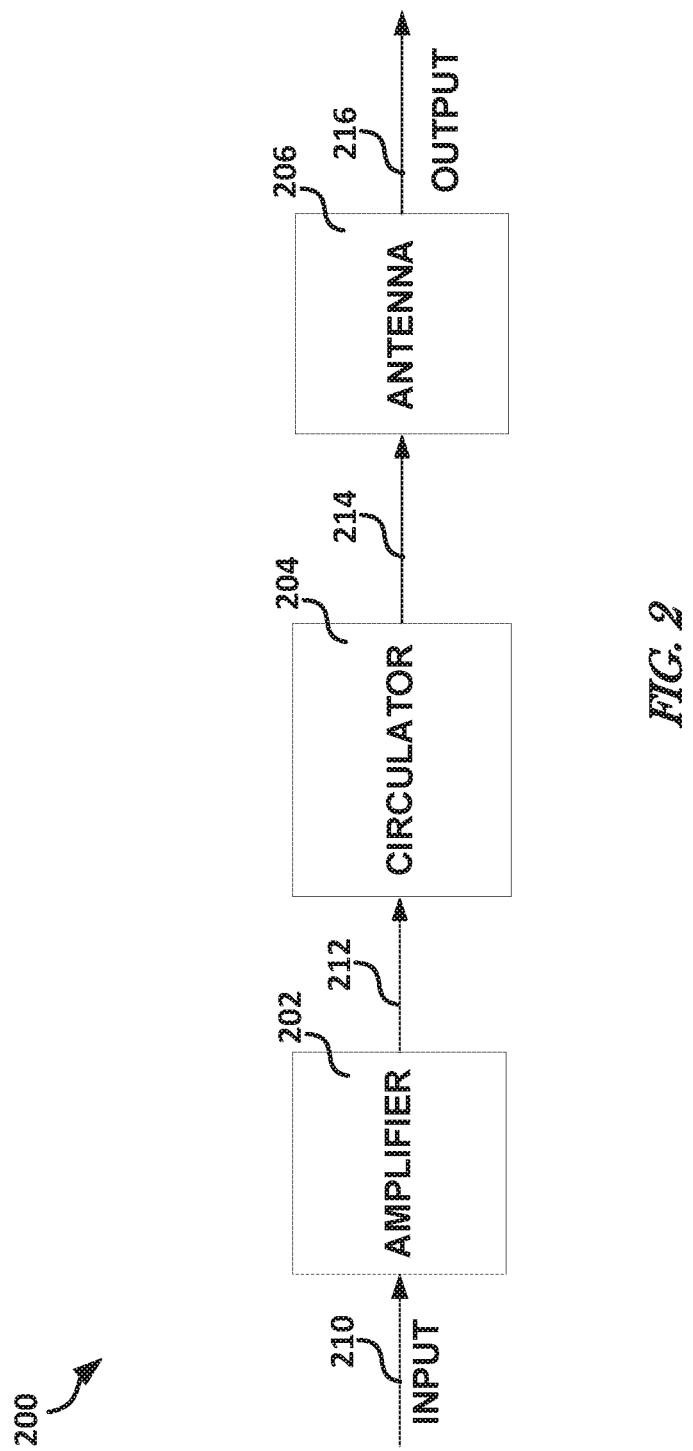
FIG. 2 illustrates, by way of example, a diagram of a system to produce a signal and harmonics of the signal.

FIG. 2 illustrates, by way of example, a diagram of a system 200 to produce a signal that includes a fundamental frequency and one or more harmonics of the fundamental frequency. The system 200 as illustrated includes an amplifier 202, an optional circulator 204, and an antenna 206.

The amplifier 202 receives an input 210. The input 210 can include a sine wave of a primary frequency. The amplifier 202 produces an amplified output 212. For an amplifier operating in a linear region, the amplified output 212 includes the input 210 multiplied by a constant, generally greater than one, along with noise. For an amplifier operating in a non-linear region (e.g., a compression region), the amplified output 212 includes the input 210 multiplied by a constant, generally greater than one, along with harmonics and noise. The compression region of the amplifier is described regarding FIG. 3.

The amplifier 202, in one or more embodiments, can include one or of a gallium nitride (GaN) amplifier, gallium arsenide (GaAs) amplifier, or another wideband amplifier. A wideband amplifier has a generally uniform gain over a large frequency range. A narrowband amplifier has a generally uniform gain over a narrow frequency range. For example, a narrowband amplifier has a frequency range that excludes all harmonics from the amplification, while the wideband amplifier includes one or more harmonics in an amplification range. For example, consider a primary frequency at 100 MHz, a narrowband amplifier can have a frequency range of 10 MHz or 20 MHz, and because of its limited range, the narrowband amplifier can exclude all harmonics from the amplification. Some narrow band amplifiers include bandpass filters at their output to block frequencies outside of the intended range. In contrast, a wideband amplifier might have a range of 65 MHz to 920 MHz or greater. Considering the same example of a 100 MHz primary frequency, the wideband amplifier can amplify harmonics at 200 MHz, 400 MHz, or 800 MHz.

The input 210 can include a signal of a primary frequency. In one or more embodiments, the signal can include one or more harmonic frequencies. The amplifier 202 can amplify the primary frequency and/or the one or more harmonic frequencies. The amplifier 202 can be operated in a compression region, such as in embodiments that do not include the one or more harmonics on the input 210, and harmonics will be generated by the amplifier operated in the compression region. In embodiments in which the one or more harmonics are provided on the input 210, the amplifier 202 can be operated in a linear region.

The circulator 204 is a passive circuit device that transmits a signal incident on a port on a next port in a rotation of ports. For example, for a three-port circulator, a signal incident on a first port is transmitted on a second port, a signal incident on the second port is transmitted on a third port, and signal incident on the third port is transmitted on the first port. In one or more embodiments, the first port is electrically coupled to the amplified input 212, the second port is electrically coupled to a transmitter (e.g., the antenna 206), and the third port is electrically coupled to a receiver. The circulator 204 is generally not a lossless device. The loss from the circulator 204 can be frequency dependent, such as can be represented by a transfer function.

The antenna 206 converts signals on the antenna input 214 to electromagnetic waves. The antenna 206 is an example of the transducer 108 capable of propagating signals in free space. The antenna 206 can convert signals on an antenna input 214, which can be coupled to an output of the circulator 204, to electromagnetic waves. In one or more embodiments, the antenna 206 can include an array of antennas. The array of antennas can be arranged in a grid, such as to form a beam steering array that can control a direction of electrical energy produced by the array of antennas. In one or more embodiments, the array of antennas can be configured as an active electronically scanned array (AESA). The AESA can adjust a gain and/or phase of a signal provided to each antenna of the array to cause the collective transmissions of the array of the antenna to form a beam in a specified direction. Alternatively, a single amplified signal can be delayed by an adjustable amount and distributed to an array of antennas to form a steerable beam. Thus, the antenna 206 can produce a directed transmission 216. The antenna 206 can provide a frequency dependent gain to the antenna input 214, such as can be represented by a transfer function. The antenna 206 can amplify a fundamental frequency and a harmonic frequency.

Figure 3:
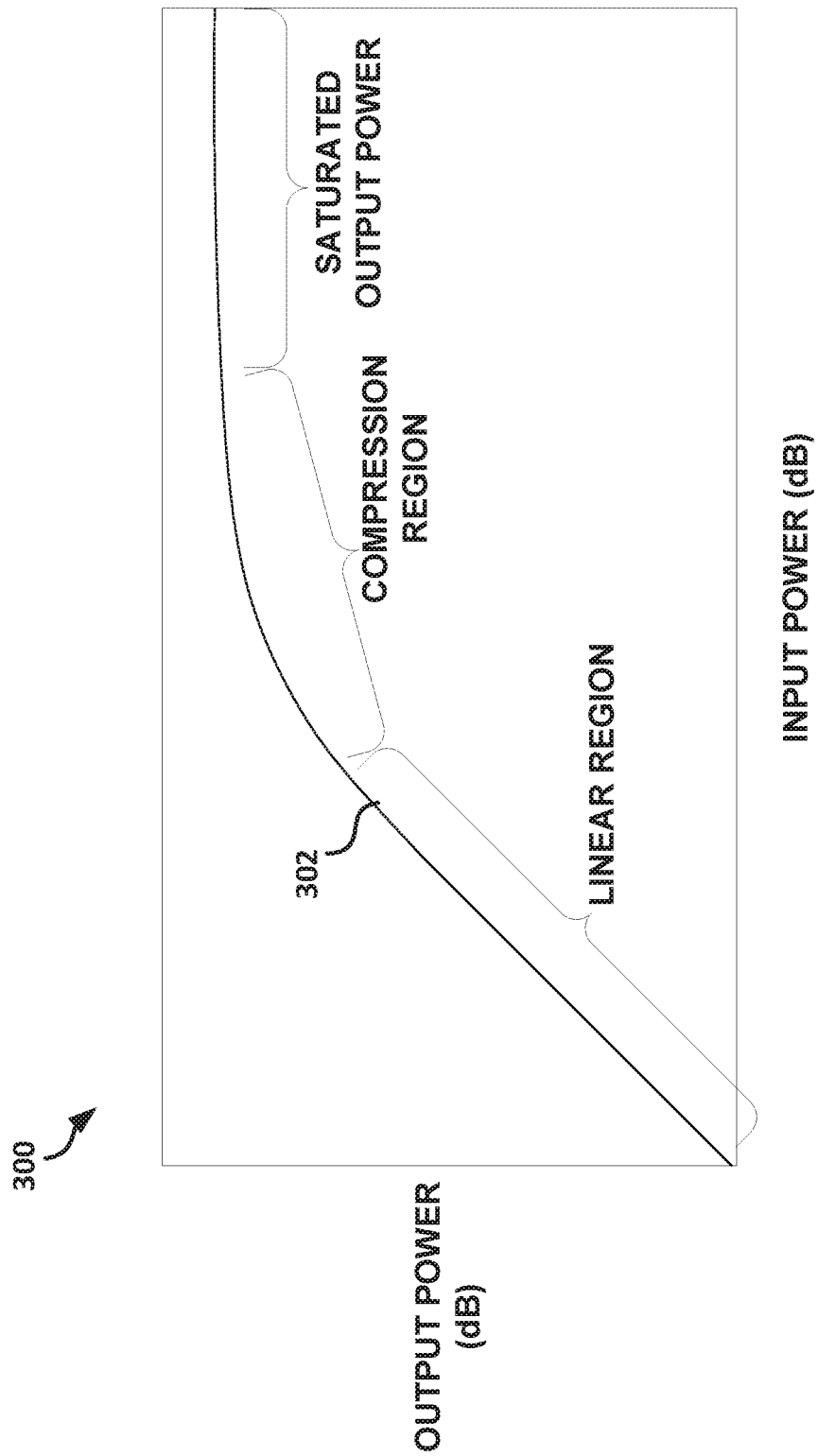
FIG. 3 illustrates, by way of example, a graph of amplifier input power versus output power.

FIG. 3 illustrates, by way of example, a graph 300 of amplifier input power versus output power. The graph 300, as illustrated, includes a line 302 representing a ratio of output power to input power. The line 302 includes three regions, a linear region, a compression region, and a saturated output power region. The linear region of the line 302 is often referred to as a "small-signal gain". When operating the amplifier in this region, the increase in gain of the amplifier is linear as a function of input power. The compression region of the line 302 is an area of the amplifier output in which the output power does not increase linearly relative to output power. In this region, given a sinusoidal input, the signal provided by amplifier may not be sinusoidal. Because the output is not sinusoidal, a Fourier transform of the output shows some of the amplifier output, instead appears at harmonics of the fundamental frequency of the sinusoidal input. The saturated power region of the line 302 is an area of the amplifier output in which the output power no longer increases (e.g., remains constant) even with an increase in input power.

In an embodiment in which the amplifier 202 is operated in the linear region, harmonics can be provided as part of the input 210. The harmonics, if within the amplifier bandwidth, can be amplified by the amplifier 202 and provided as part of the amplified input 212. In an embodiment in which the amplifier 202 is operated in the compression region, harmonics can be produced by the amplifier 202 and the input 210 can include a sinusoid at a fundamental frequency, such as without harmonics.

Figure 4:
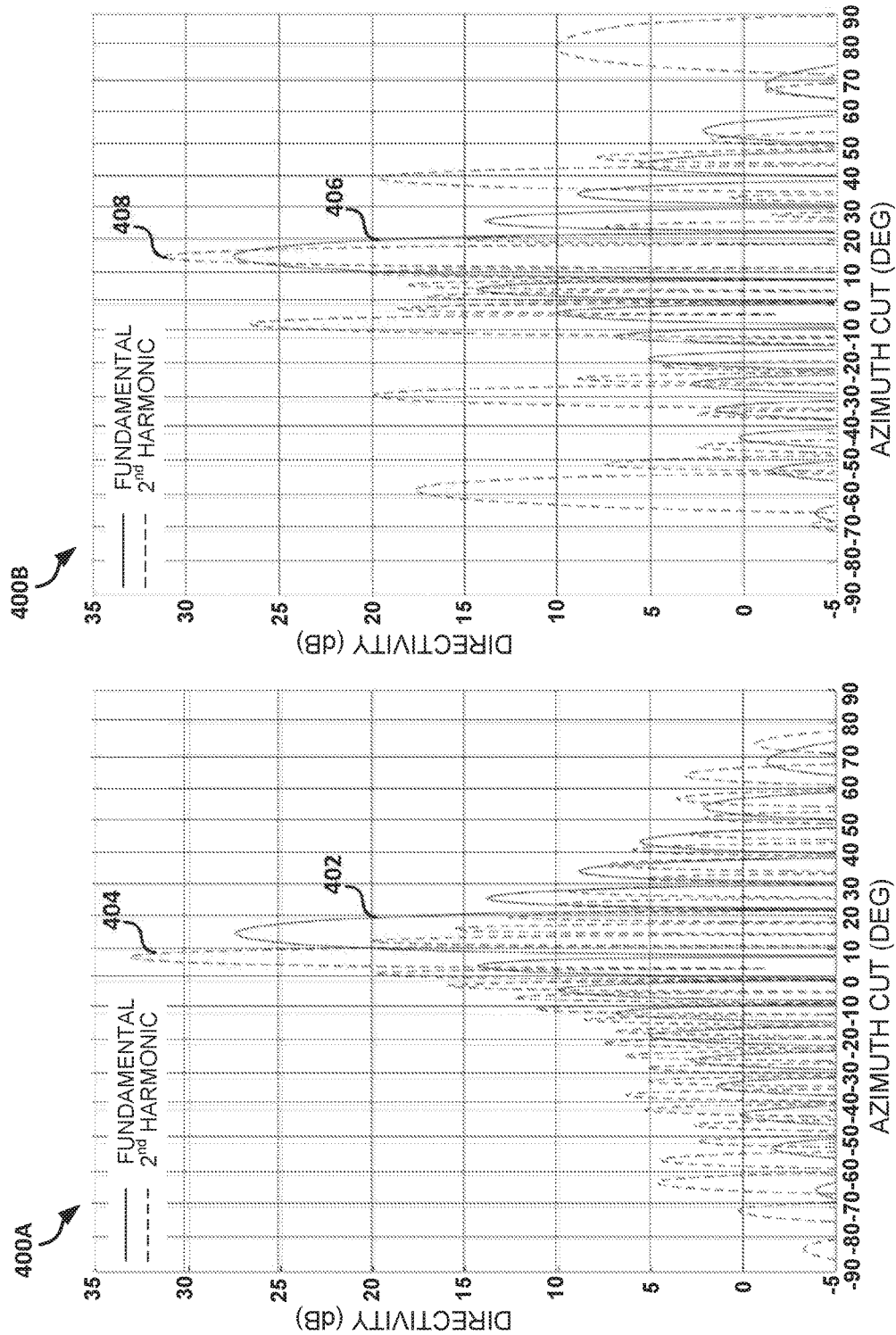
FIG. 4A illustrates, by way of example, a graph of azimuth cut vs directivity for a fundamental signal and a corresponding second harmonic of the fundamental signal in a phase shifter beam steering architecture.
FIG. 4B illustrates, by way of example, a graph of azimuth cut vs directivity for a fundamental signal and a corresponding second harmonic of the fundamental signal in a time delay beam steering architecture.

FIG. 4A illustrates, by way of example, a graph 400A of azimuth cut versus directivity for a fundamental signal and a corresponding second harmonic of the fundamental signal. FIG. 4A represents steering with a phase shifter architecture. The graph 400A illustrates azimuth versus directivity for a phase-based beam steering system. Generally, a direction of an Nth harmonic beam can be determined based on a beam steering equation:

$$\frac{\theta_{harmonic}}{\theta_{fundamental}} = \frac{1}{N_{harmonic}} \qquad \text{Equation 1}$$

where $\theta_{harmonic}$ is an angle at which a harmonic is transmitted, $\theta_{fundamental}$ is an angle at which a fundamental is transmitted, and $N_{harmonic}$ is the harmonic number of the harmonic of interest. For example, a second harmonic of a fundamental frequency transmitted at an angle of 30 degrees would be transmitted at an angle of $$\theta_{harmonic} = \frac{30}{2} deg = 15 \ deg.$$

Thus, the direction of the harmonic can be determined using Equation 1.

Referring to FIG. 4A, a fundamental frequency, represented by line 402, is transmitted at about 15 degrees, which results in a second harmonic, represented by line 404, being transmitted at about 7.5 degrees. This is consistent with Equation 1.

FIG. 4B illustrates, by way of example, a graph 400B of azimuth cut versus directivity for a fundamental signal and a corresponding second harmonic of the fundamental signal. FIG. 4A represents steering with a time delay architecture. The graph 400B illustrates azimuth versus directivity for a time delay based beam steering system. Generally, the direction of an Nth harmonic beam can be determined based on a beam steering equation:

$$\frac{\theta_{harmonic}}{\theta_{fundamental}} = 1 \qquad \text{Equation 2}$$

In a time delay based beam steering architecture, the fundamental and the harmonic frequency are transmitted at a same angle (e.g., in a same direction). For example, a second harmonic of a fundamental frequency transmitted at an angle of 30 degrees would be transmitted at an angle of $\theta_{harmonic}$=30*1 deg=30 deg. Thus, the path of the harmonic can be determined as the path of the fundamental. An embodiment that includes a beam steer architecture that is a combination of both a time delay and a phase shift architecture can include a harmonic angle greater than a pure time delay architecture and less than a pure phase shifter architecture.

Referring to FIG. 4B, a fundamental frequency, represented by line 406, is transmitted at about 15 degrees, which results in a second harmonic, represented by line 408, being transmitted at about 15 degrees as well. This is consistent with Equation 2.

Beam width (which characterizes the angular region of a radiation pattern in free space, not a frequency bandwidth) is independent of whether the beam steering system is a time delay system or a phase shift system. In both systems, the beam width can be determined based on:

$$\frac{BW_{harmonic}}{BW_{fundamental}} = \frac{1}{N_{harmonic}} \qquad \text{Equation 3}$$

where $BW_{harmonic}$ is a beam width of a transmission at the harmonic frequency and $BW_{fundamental}$ is a beam width of a transmission at the fundamental frequency. Thus, if a transmission at a fundamental frequency has a 2-degree beam width, the beam width of the second harmonic of the transmission would be $$BW_{harmonic} = \frac{2}{2} \text{degrees} = 1 \text{ degree}.$$

A harmonic of a transmission is a portion of the transmission that is a positive integer multiple of a desired frequency of the transmission, known as the fundamental frequency. The fundamental frequency is sometimes referred to as the first harmonic. Consider a transmission at a fundamental frequency of 100 Hertz. The second harmonic would be at a frequency of 200 Hertz, a third harmonic would be at a frequency of 300 Hertz, and so on.

Figure 5:
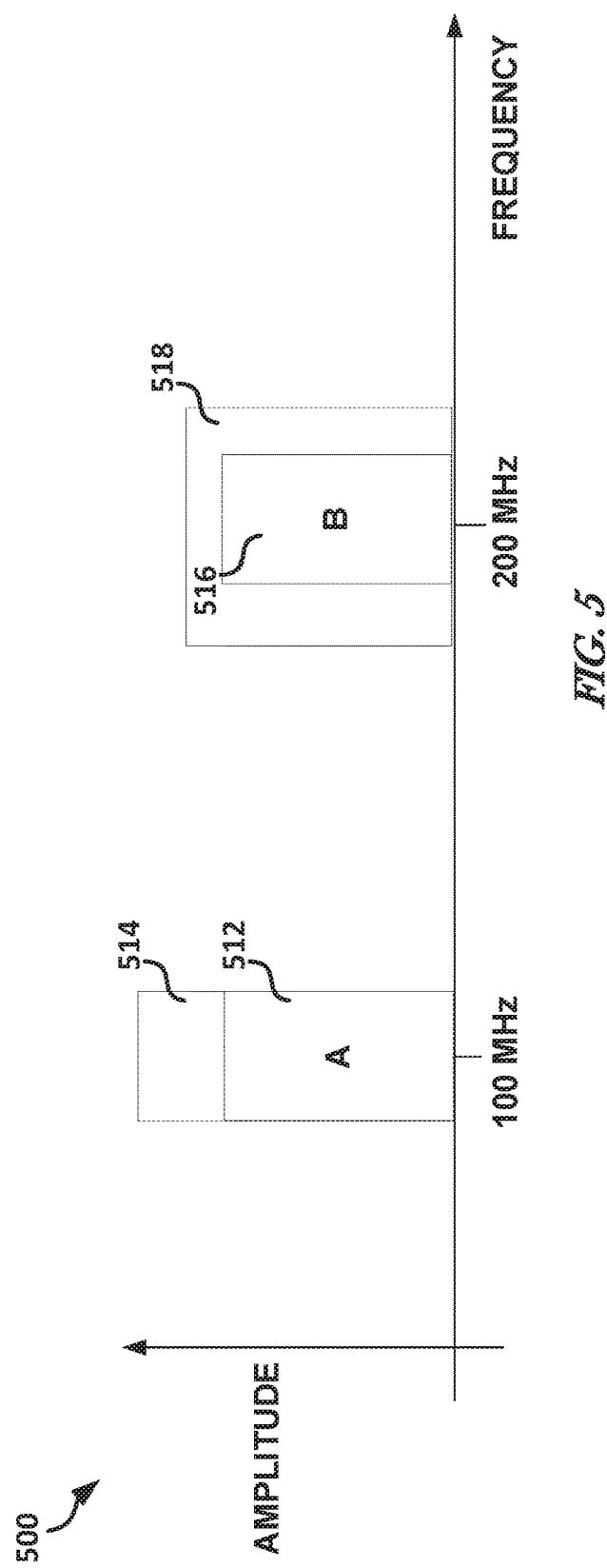
FIG. 5 illustrates, by way of example, a block diagram of an embodiment of a graph of job and transmitter characteristics.

FIG. 5 illustrates, by way of example, a block diagram of an embodiment of a graph 500 of job data detailing job (e.g., RF or other energy requests) and transmitter characteristics. The jobs illustrated include job A 512 and job B 516. The jobs can be for providing signals to target destinations. The jobs 512 or 516 can include a communication (e.g., a wave modulated with data), a noise transmission (e.g., a wave modulated with random or no data), or the like. The characteristics illustrated include a frequency range and amplitude of a transmitter transmission, represented by box 514 (fundamental) and box 518 ($2^{nd}$ harmonic). The jobs 512 and 516 can include a communication (a wave modulated with data), a noise transmission (a wave modulated with random or no data), or the like. The characteristics can include one or more of an amplitude, frequency, position, direction, priority, time, or the like. In one or more embodiments, the jobs 512 and 516 and transmitter characteristics 514 and 518 can be for communication, or otherwise providing signals, waves, or energy to a target device.

In the embodiment illustrated in FIG. 5, in response to job 512, transmitter characteristics 514 and 518 can be generated. The frequency extent of job B 516 can be fulfilled by the second harmonic of a transmission at a fundamental frequency of 100 Hertz. The transmission characteristics (represented by boxes 514 and 518) fulfill the frequency bandwidth, frequency, and amplitude requirements of both job A 512 and job B 516. If the beam steering architecture provides the second harmonic at the location of job B 516 when transmitting at the frequency for job A 512, the two jobs, job A 512 and job B 516, can be accomplished using a same transmission.

Figure 6:
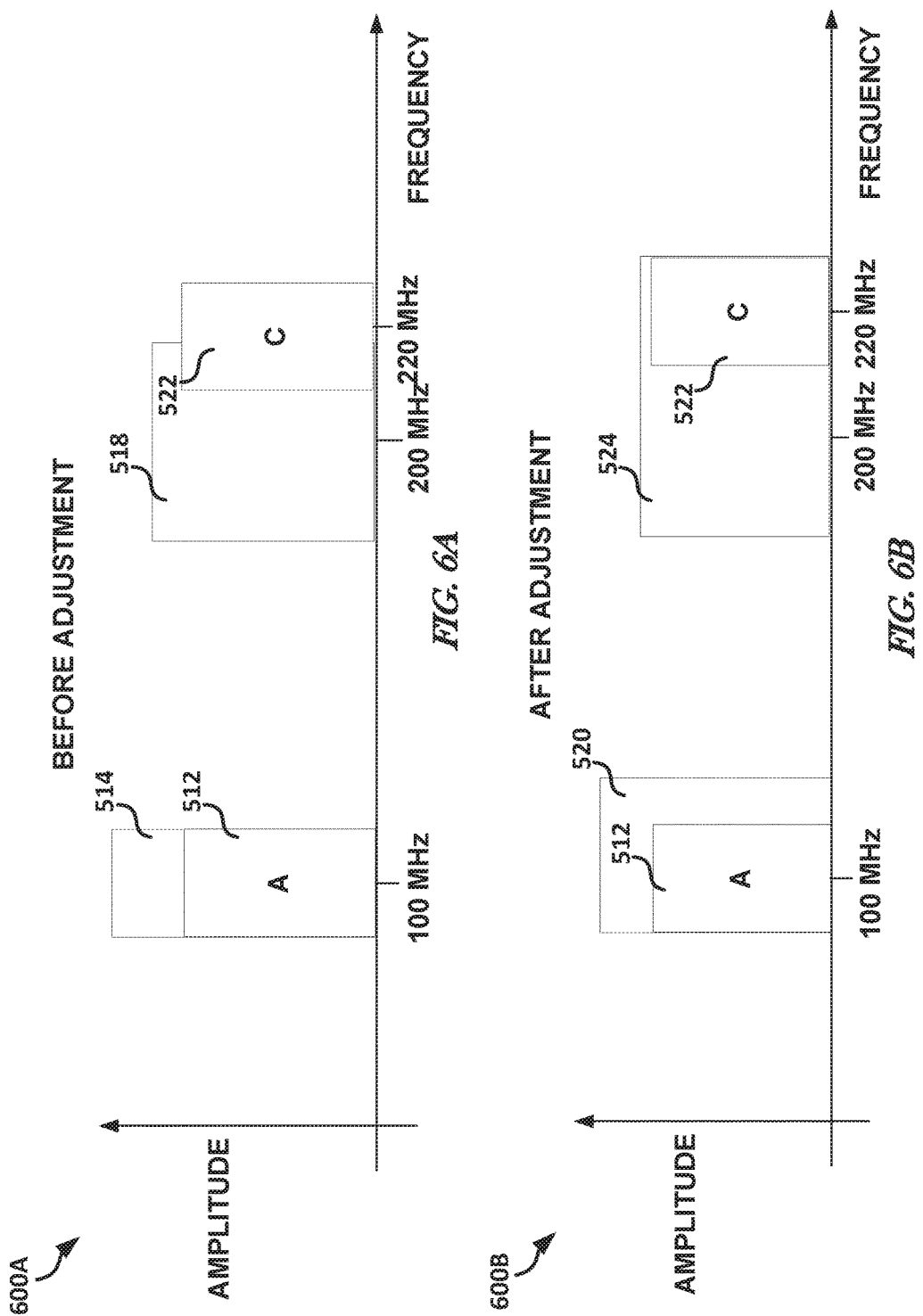
FIG. 6A illustrates, by way of example, a block diagram of an embodiment of another graph of job and transmitter characteristics before an adjustment to a signal.
FIG. 6B illustrates, by way of example, a block diagram of an embodiment of another graph of job and transmitter characteristics after an adjustment to a signal.

FIG. 6A illustrates, by way of example, a block diagram of an embodiment of other graphs 600A and 600B of job (e.g., RF, acoustic, mechanical, or other energy request) and transmitter characteristics before and after adjustment, respectively. The jobs illustrated include job A 512 and job C 522. The characteristics illustrated include a frequency range and amplitude of an electromagnetic transmission, represented by box 514 and box 518. The second harmonic of the transmitter characteristics, represented by the box 518, is not sufficient to perform job C 522. However, job A 512 can be satisfied even if the fundamental frequency of the transmitter characteristics are extended ten Megahertz, such as to 110 Hertz, represented by box 520. If such an adjustment is made, the frequency of the second harmonic can fulfill job C 522 (if location requirements are met). FIGS. 6A and 6B helps illustrate how a transmission can be adjusted in frequency to cover multiple jobs.

Figure 7:
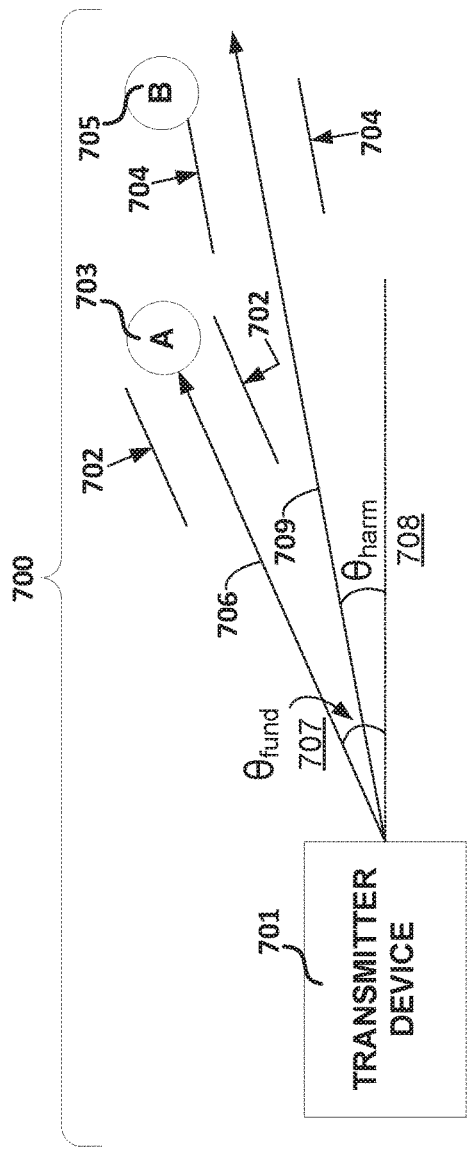
FIGS. 7 and 8 illustrate, by way of example, diagrams of respective embodiments of a communication system.
Figure 8:
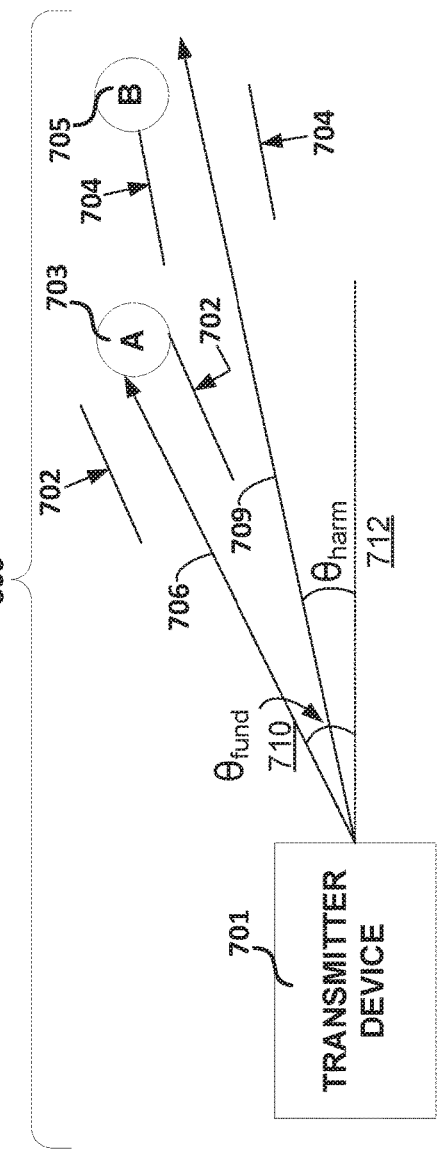

FIGS. 7 and 8 illustrate, by way of example, diagrams of respective embodiments of a communication system 700 and 800. The system 700 as illustrated includes a transmitter device 701 and target objects 703 and 705. The transmitter device 701 can include one or more of the components illustrated in or discussed regarding FIG. 1, FIG. 2, or FIG. 10. The target objects 703 and 705 can be respective targets associated with job A 512 and job B 516 (see FIGS. 5-6). The transmitter 701 and target objects 703 and 705 can include communication circuitry, such as a transmit, receive, or transceiver radio, one or more modulators, amplifiers, analog to digital converters, digital to analog converters, phase locked loops, antennas, or the like. The transmitter device 701 can be a part of a vehicle, such as an unmanned aerial vehicle or other vehicle, a non-motorized device, or the like. The transmitter device 701 can include an antenna array, such as an AESA.

The transmitter device 701 can produce electromagnetic radiation with a fundamental frequency portion 707 and a harmonic frequency portion 709. The fundamental frequency portion 707 can be transmitted at an angle, $\theta_{fundamental}$ 706. The harmonic frequency portion 709 is thus transmitted at a different angle (assuming a phase shifter beam steering architecture), $\theta_{harmonic}$ 708. Beam widths of the corresponding fundamental frequency portion 707 and the harmonic frequency portion 709 are represented by $BW_{fundamental}$ 702 and $BW_{harmonic}$ 704, respectively.

In the embodiment of FIG. 7, the harmonic frequency portion 709 is at a location that mostly misses the object 705 that is the target of job B 516. By adjusting $\theta_{fundamental}$ 706, the electromagnetic radiation transmission (including the fundamental frequency portion 707 and the harmonic frequency portion 709) can be adjusted to make the electromagnetic radiation better cover the object 705.

An example of an adjusted electromagnetic radiation transmission is provided in FIG. 8. $\theta_{fundamental}$ 710 of FIG. 8 is larger than $\theta_{fundamental}$ 706 of FIG. 7. This adjustment in $\theta_{fundamental}$ causes a shift in the direction of the harmonic frequency portion 709, represented by $\theta_{harmonic}$ 708. $\theta_{harmonic}$ 712 of FIG. 8 is larger than $\theta_{harmonic}$ 708 of FIG. 7. The change in $\theta_{harmonic}$ can be calculated using Equation 1 or Equation 2. The $BW_{fundamental}$ 702 and $BW_{harmonic}$ 704 can be determined using Equation 3.

Figure 9:
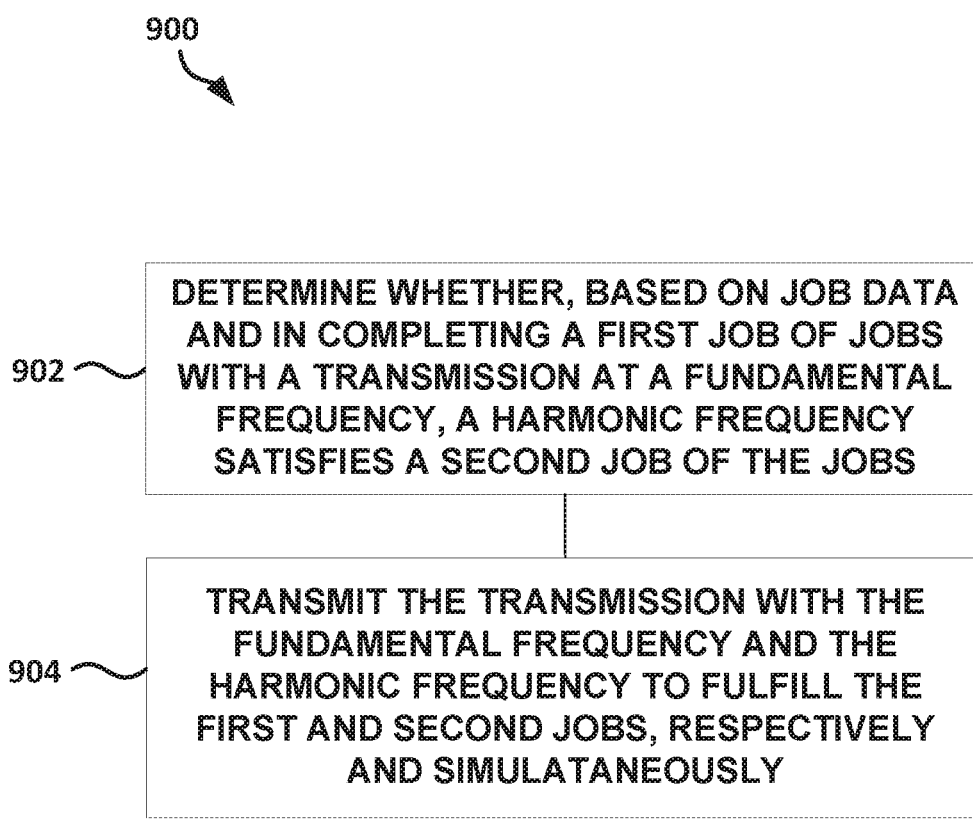
FIG. 9 illustrates, by way of example, an embodiment of a method for using a fundamental frequency to complete a first job and a harmonic frequency of the fundamental frequency to simultaneously complete a second job.

FIG. 9 illustrates, by way of example, an embodiment of a method 900 for using harmonics in a communication to a device, such as to fulfill jobs simultaneously. The method 900 as illustrated includes determining (by at least one hardware processor of a device) whether, based on job data and in completing a first job of jobs with a transmission at a fundamental frequency, a harmonic frequency of the fundamental frequency satisfies a second job of the jobs, at operation 902; and transmitting (by transmit circuitry of the device) the transmission with the fundamental frequency and the harmonic frequency to complete the first and second jobs, respectively and simultaneously, at operation 904.

The method 900 can further include receiving, at an amplifier of the transmit circuitry, signals at the harmonic frequency and the fundamental frequency, and amplifying, using the amplifier, the signals. The method 900 can further include receiving, at an amplifier of the transmit circuitry, signals at the fundamental frequency, and operating the amplifier to produce the amplified fundamental frequency signals and signals at the harmonic frequency. The method 900 can further include, wherein the amplifier includes a Gallium Nitride (GaN) amplifier.

The method 900 can further include, wherein the transmit circuitry includes an antenna array configured to transmit the fundamental frequency and the harmonic frequency simultaneously. The method 900 can further include, determining whether adjusting a characteristic of the transmission causes an adjusted harmonic frequency of the transmission to satisfy the second job, and in response to a determination that the adjusted harmonic frequency satisfies the second job, adjusting the transmission so that an adjusted harmonic frequency of the adjusted transmission fulfills the second job. The method 900 can further include, wherein the memory further includes data indicating a priority for each job of the jobs, and wherein the first job is the job with the highest priority and the second job is a job of lower priority than the first job.

The method 900 can further include adjusting a beam width of a fundamental frequency of the transmission so that a harmonic frequency of the adjusted transmission satisfies the second job. The method 900 can further include controlling the transmit circuitry to adjust a direction of a fundamental frequency of the transmission so that the fundamental frequency satisfies the first job and the harmonic frequency satisfies the second job.

Adjustments to frequency, direction, beam width, modulation, or the like of a wave can be determined solving a constraint optimization problem. A job with a higher priority can be associated with a first cost and assigned to a fundamental frequency of electromagnetic radiation. A job with a lower priority can be associated with a second, lower cost. The adjustment can account for changes in power of the wave incident on the target, such as to ensure that the higher priority job requirements are still met. Frequency spreading can be used to adjust a bandwidth of a primary frequency and resultant harmonic frequencies.

Some systems allow multiple beams to be produced and transmitted concurrently. These systems do not use harmonics in the manner as embodiments discussed herein. These systems do not transmit an amplified harmonic frequency from a same amplifier that provided an amplified version of the fundamental frequency and transmit the fundamental and harmonic frequencies from the same antenna(s) to interact with multiple targets. Rather, these systems use different amplifiers and different antennas to reach multiple targets.

Figure 10:
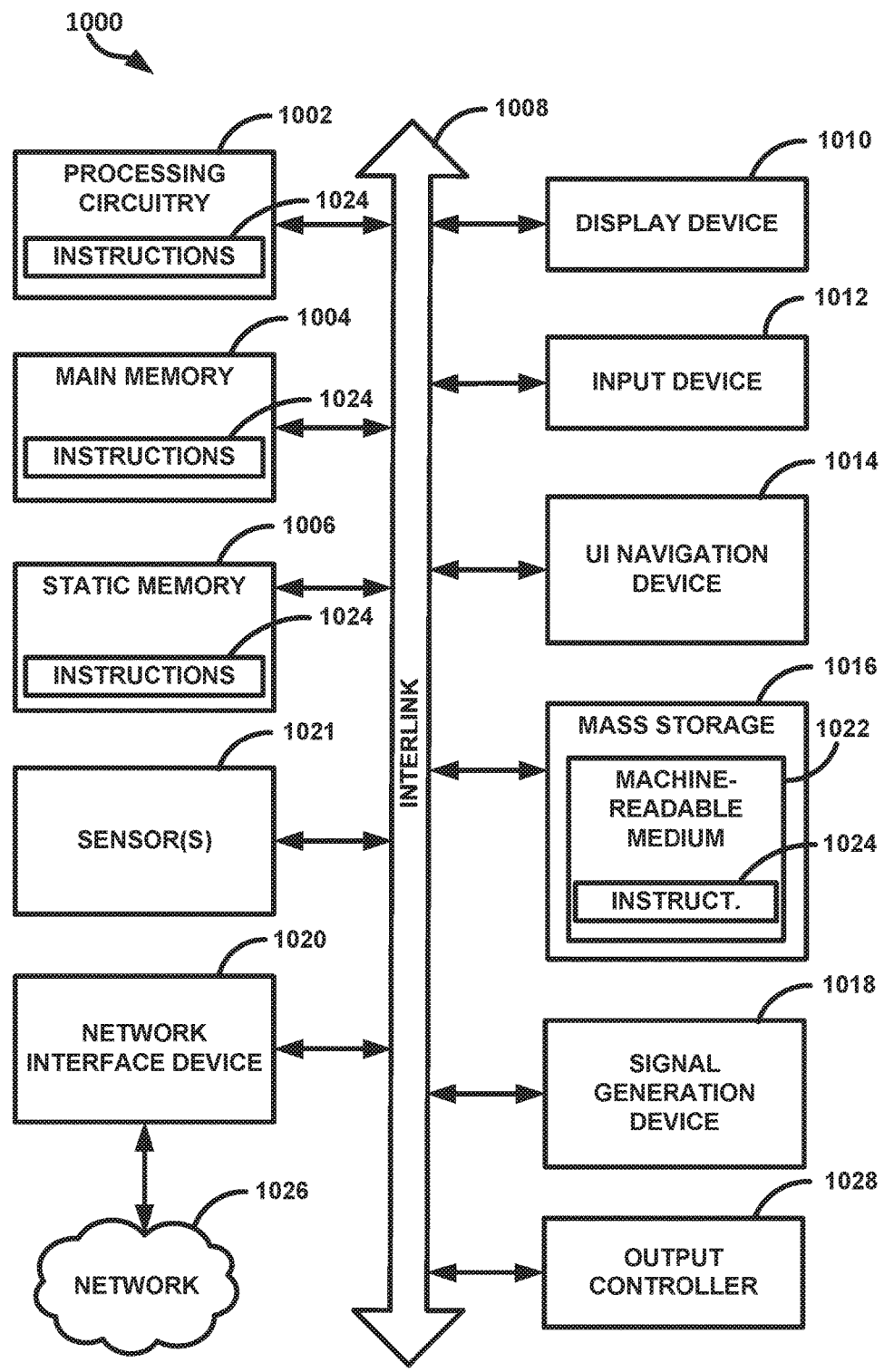
FIG. 10 illustrates, by way of example, a block diagram of an embodiment of a machine on which one or more of the methods, such as those discussed about FIG. 9 and elsewhere herein can be implemented.

FIG. 10 illustrates, by way of example, a block diagram of an embodiment of a machine 1000 on which one or more of the methods, such as those discussed about FIG. 9 and elsewhere herein can be implemented. In one or more embodiments, one or more items of the signal generator and controller 102, exciter 104, node 112A-112C, or node 703 or 705 can be implemented by the machine 1000. In alternative embodiments, the machine 1000 operates as a standalone device or may be connected (e.g., networked) to other machines. In one or more embodiments, the signal generator and controller 102, exciter 104, node 112A-112C, or node 703 or 705 can include one or more of the items of the machine 1000. In a networked deployment, the machine 1000 may operate in the capacity of a server or a client machine in server-client network environment, or as a peer machine in a peer-to-peer (or distributed) network environment. The machine 1000 may be a personal computer (PC), a tablet PC, a set-top box (STB), a Personal Digital Assistant (PDA), a cellular telephone, a web appliance, a network router, switch or bridge, embedded computer or hardware, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein.

The example machine 1000 includes processing circuitry 1002 (e.g., a hardware processor, such as can include a central processing unit (CPU), a graphics processing unit (GPU), an application specific integrated circuit, circuitry, such as one or more transistors, resistors, capacitors, inductors, diodes, logic gates, multiplexers, oscillators, buffers, modulators, regulators, amplifiers, demodulators, or radios (e.g., transmit circuitry or receive circuitry or transceiver circuitry, such as RF or other electromagnetic, optical, audio, non-audible acoustic, or the like), sensors 1021 (e.g., a transducer that converts one form of energy (e.g., light, heat, electrical, mechanical, or other energy) to another form of energy), or the like, or a combination thereof), a main memory 1004 and a static memory 1006, which communicate with each other and all other elements of machine 1000 via a bus 1008. The transmit circuitry or receive circuitry can include one or more antennas, oscillators, modulators, regulators, amplifiers, demodulators, optical receivers or transmitters, acoustic receivers (e.g., microphones) or transmitters (e.g., speakers) or the like. The RF transmit circuitry can be configured to produce energy at a specified primary frequency to include a specified harmonic frequency.

The machine 1000 (e.g., computer system) may further include a video display unit 1010 (e.g., a liquid crystal display (LCD) or a cathode ray tube (CRT)). The machine 1000 also includes an alphanumeric input device 1012 (e.g., a keyboard), a user interface (UI) navigation device 1014

(e.g., a mouse), a disk drive or mass storage unit 1016, a signal generation device 1018 (e.g., a speaker) and a network interface device 1020.

The mass storage unit 1016 includes a machine-readable medium 1022 on which is stored one or more sets of instructions and data structures (e.g., software) 1024 embodying or utilized by any one or more of the methodologies or functions described herein. The instructions 1024 may also reside, completely or at least partially, within the main memory 1004 and/or within the processing circuitry 1002 during execution thereof by the machine 1000, the main memory 1004 and the processing circuitry 1002 also constituting machine-readable media. One or more of the main memory 1004, the mass storage unit 1016, or other memory device can store the job data, transmitter characteristics, or other data for executing the method 900.

The machine 1000 as illustrated includes an output controller 1028. The output controller 1028 manages data flow to/from the machine 1000. The output controller 1028 is sometimes called a device controller, with software that directly interacts with the output controller 1028 being called a device driver.

While the machine-readable medium 1022 is shown in an example embodiment to be a single medium, the term "machine-readable medium" may include a single medium or multiple media (e.g., a centralized or distributed database, and/or associated caches and servers) that store the one or more instructions or data structures. The term "machine-readable medium" shall also be taken to include any tangible medium that can store, encode or carry instructions for execution by the machine and that cause the machine to perform any one or more of the methodologies of the present invention, or that can store, encode or carry data structures utilized by or associated with such instructions. The term "machine-readable medium" shall accordingly be taken to include, but not be limited to, solid-state memories, and optical and magnetic media. Specific examples of machine-readable media include non-volatile memory, including by way of example semiconductor memory devices, e.g., Erasable Programmable Read-Only Memory (EPROM), Electrically Erasable Programmable Read-Only Memory (EEPROM), and flash memory devices; magnetic disks such as internal hard disks and removable disks; magneto-optical disks; and CD-ROM and DVD-ROM disks.

The instructions 1024 may further be transmitted or received over a communications network 1026 using a transmission medium. The instructions 1024 may be transmitted using the network interface device 1020 and any one of several well-known transfer protocols (e.g., hypertext transfer protocol (HTTP), user datagram protocol (UDP), transmission control protocol (TCP)/internet protocol (IP)). The network 1026 can include a point-to-point link using a serial protocol, or other well-known transfer protocol. Examples of communication networks include a local area network ("LAN"), a wide area network ("WAN"), the Internet, mobile telephone networks, Plain Old Telephone (POTS) networks, and wireless data networks (e.g., WiFi and WiMax networks). The term "transmission medium" shall be taken to include any intangible medium that can store, encode or carry instructions for execution by the machine, and includes digital or analog communications signals or other intangible media to facilitate communication of such software.

EXAMPLES AND ADDITIONAL NOTES

Example 1 can include a device including transmit circuitry, a memory including job data indicating characteristics of jobs to be completed using the transmit circuitry, the characteristics indicating a frequency, power, and location of a transmission required to complete a job of the jobs, at least one hardware processor coupled to the transmit circuitry and the memory, the at least one hardware processor configured to determine whether, based on the job characteristics and in completing a first job of the jobs with a signal at a fundamental frequency, a harmonic frequency of the fundamental frequency satisfies a second job of the jobs, and cause the transmit circuitry to transmit the signal including the fundamental frequency and the harmonic frequency to fulfill the first and second jobs, respectively and simultaneously.

In Example 2, Example 1 can further include, wherein the transmit circuitry includes an amplifier and the harmonic frequency and the fundamental frequency are provided as input to the amplifier.

In Example 3, at least one of Examples 1-2 can further include, wherein the transmit circuitry includes an amplifier and the harmonic frequency is produced by the amplifier.

In Example 4, at least one of Examples 1-3 can further include, wherein the transmit circuitry includes a Gallium Nitride (GaN) amplifier.

In Example 5, at least one of Examples 1-4 can further include, wherein the transmit circuitry includes an antenna array configured to transmit the fundamental frequency and the harmonic frequency simultaneously.

In Example 6, Example 5 can further include, wherein the antenna array is an active electronically scanned array (AESA).

In Example 7, at least one of Examples 1-6 can further include, wherein the at least one hardware processor is further configured to determine whether adjusting a characteristic of the signal causes a harmonic frequency of the adjusted signal to fulfill the second job of the jobs, and in response to a determination that the adjusted signal satisfies the second job, adjusting the signal so that the adjusted signal fulfills the first job the second job simultaneously.

In Example 8, at least one of Examples 1-7 can further include, wherein the memory further includes data indicating a priority for each job of the jobs, and wherein the first job is the job with the highest priority and the second job is a job of lower priority than the first job.

In Example 9, at least one of Examples 1-8 can further include, wherein the at least one hardware processor is further to adjust a beam width of the fundamental frequency of the signal so that the harmonic frequency of the signal satisfies the second job.

In Example 10, at least one of Examples 1-9 can further include, wherein the at least one hardware processor is further configured to control the transmit circuitry to adjust a direction of the fundamental frequency so that the fundamental frequency of the signal satisfies the first job and the harmonic frequency of the signal satisfies the second job.

Example 11 can include a method of completing jobs simultaneously, the method including determining, by at least one hardware processor of a device, whether, based on job data and in completing a first job of jobs with a transmission at a fundamental frequency, a harmonic frequency of the fundamental frequency satisfies a second job of the jobs, and transmitting, by transmit circuitry of the device, the transmission with the fundamental frequency and the harmonic frequency to complete the first and second jobs, respectively and simultaneously.

In Example 12, Example 11 can further include receiving, at an amplifier of the transmit circuitry, signals at the harmonic frequency and the fundamental frequency, and amplifying, using the amplifier, the signals.

In Example 13, at least one of Examples 11-12 can further include receiving, at an amplifier of the transmit circuitry, signals at the fundamental frequency, and operating the amplifier to produce the amplified fundamental frequency signals and signals at the harmonic frequency.

In Example 14, Example 13 can further include, wherein the amplifier includes a Gallium Nitride (GaN) amplifier.

In Example 15, at least one of Examples 11-14 can further include, wherein the transmit circuitry includes an antenna array configured to transmit the fundamental frequency and the harmonic frequency simultaneously.

In Example 16, at least one of Examples 11-15 can further include determining whether adjusting a characteristic of the transmission causes an adjusted harmonic frequency of the transmission to satisfy the second job, and in response to a determination that the adjusted harmonic frequency satisfies the second job, adjusting the transmission so that an adjusted harmonic frequency of the adjusted transmission fulfills the second job.

In Example 17, at least one of Examples 11-16 can further include, wherein the memory further includes data indicating a priority for each job of the jobs, and wherein the first job is the job with the highest priority and the second job is a job of lower priority than the first job.

In Example 18, at least one of Examples 11-17 can further include adjusting a beam width of a fundamental frequency of the transmission so that a harmonic frequency of the adjusted transmission satisfies the second job.

In Example 19, at least one of Examples 11-18 can further include controlling the transmit circuitry to adjust a direction of a fundamental frequency of the transmission so that the fundamental frequency satisfies the first job and the harmonic frequency satisfies the second job.

Example 20 can include at least one non-transitory machine-readable storage device including instructions stored thereon that, when executed by a machine, configure the machine to perform operations comprising determining whether, based on job data stored in a memory and in completing a first job of jobs with a transmission at a fundamental frequency, a harmonic frequency of the transmission satisfies a second job of the jobs, and producing one or more signals that cause transmit circuitry to transmit the transmission with the fundamental frequency and the harmonic frequency to complete the first and second jobs, respectively and simultaneously.

In Example 21, Example 20 can further include, wherein the at least one hardware processor is further configured to determine whether adjusting a characteristic of the transmission causes an adjusted harmonic frequency of the transmission to satisfy the second job, and in response to a determination that the adjusted harmonic frequency satisfies the second job, adjusting the transmission so that an adjusted harmonic frequency of the adjusted transmission fulfills the second job.

In Example 22, at least one of Examples 20-21 can further include, wherein the memory further includes data indicating a priority for each job of the jobs, and wherein the first job is the job with the highest priority and the second job is a job of lower priority than the first job.

In Example 23, at least one of Examples 20-22 can further include, wherein the operations further include adjusting a beam width of a fundamental frequency of the transmission so that a harmonic frequency of the adjusted transmission satisfies the second job.

In Example 24, at least one of Examples 20-23 can further include, wherein the operations further include control the transmit circuitry to adjust a direction of a fundamental frequency of the transmission so that the fundamental frequency satisfies the first job and the harmonic frequency satisfies the second job.

In Example 25, at least one of Examples 20-24 can further include wherein the operations further include provide, to an amplifier, a signal including the harmonic frequency and the fundamental frequency, and amplifying, using the amplifier, both the harmonic frequency and the fundamental frequency of the signal.

In Example 26, at least one of Examples 20-25, can further include, wherein the operations further include provide, to an amplifier, a signal at the fundamental frequency, and operating the amplifier to produce an amplified signal that includes the fundamental frequency and the harmonic frequency.

In Example 27, Example 26 can further include, wherein the amplifier includes a Gallium Nitride (GaN) amplifier.

Although an embodiment has been described with reference to specific example embodiments, it will be evident that various modifications and changes may be made to these embodiments without departing from the broader spirit and scope of the invention. Accordingly, the specification and drawings are to be regarded in an illustrative rather than a restrictive sense. The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

What is claimed is:
1. A device comprising:
  transmit circuitry;
  a memory including job data indicating characteristics of jobs to be completed using the transmit circuitry, the characteristics indicating a frequency, power, and location of a transmission required to complete a job of the jobs;
  at least one hardware processor coupled to the transmit circuitry and the memory, the at least one hardware processor configured to:
  determine whether, based on the job characteristics and in completing a first job of the jobs with a signal at a fundamental frequency, a harmonic frequency of the fundamental frequency satisfies all characteristics of a second job of the jobs, the first job associated with a first device and the second job associated with a different, second device;
  in response to a determination that the harmonic frequency of the fundamental frequency does not satisfy all characteristics of the second job, adjusting a beam width of the fundamental frequency of the signal so that the harmonic frequency of the signal satisfies the second job; and
  cause the transmit circuitry to transmit the signal including the fundamental frequency and the harmonic frequency to fulfill the first and second jobs, respectively and simultaneously.

2. The device of claim 1, wherein the transmit circuitry includes an amplifier and the harmonic frequency and the fundamental frequency are provided as input to the amplifier.

3. The device of claim 1, wherein the transmit circuitry includes an amplifier and the harmonic frequency is produced by the amplifier.

4. The device of claim 1, wherein the transmit circuitry includes a Gallium Nitride (GaN) amplifier.

5. The device of claim 1, wherein the transmit circuitry includes an antenna array configured to transmit the fundamental frequency and the harmonic frequency simultaneously.

6. The device of claim 5, wherein the antenna array is an active electronically scanned array (AESA).

7. The device of claim 1, wherein the at least one hardware processor is further configured to:
   determine whether adjusting a characteristic of the signal causes a harmonic frequency of the adjusted signal to fulfill the second job of the jobs; and
   in response to a determination that the adjusted signal satisfies the second job by adjusting a direction of the harmonic frequency, adjust the signal so that the adjusted signal fulfills the first job the second job simultaneously.

8. The device of claim 1, wherein the memory further includes data indicating a priority for each job of the jobs, and wherein the first job is the job with the highest priority and the second job is a job of lower priority than the first job.

9. The device of claim 1, wherein the at least one hardware processor is further configured to, in response to a determination that the harmonic frequency of the fundamental frequency does not satisfy all characteristics of the second job, control the transmit circuitry to adjust a direction of the fundamental frequency so that the fundamental frequency of the signal satisfies the first job and the harmonic frequency of the signal satisfies the second job.

10. A method of completing jobs simultaneously, the method comprising:
   determining, by at least one hardware processor of a device, whether, based on job data and in completing a first job of jobs with a transmission at a fundamental frequency, a harmonic frequency of the fundamental frequency satisfies all characteristics of a second job of the jobs, the first job associated with a first device and the second job associated with a different, second device;
   in response to a determination that the harmonic frequency of the fundamental frequency does not satisfy all characteristics of the second job, controlling the transmit circuitry to adjust a direction of the fundamental frequency so that the fundamental frequency of the signal satisfies the first job and the harmonic frequency of the signal satisfies the second job; and
   transmitting, by transmit circuitry of the device, the transmission with the fundamental frequency and the harmonic frequency to complete the first and second jobs, respectively and simultaneously.

11. The method of claim 10, further comprising:
   receiving, at an amplifier of the transmit circuitry, signals at the harmonic frequency and the fundamental frequency; and
   amplifying, using the amplifier, the signals.

12. The method of claim 10, further comprising:
   receiving, at an amplifier of the transmit circuitry, signals at the fundamental frequency; and
   operating the amplifier to produce the amplified fundamental frequency signals and signals at the harmonic frequency.

13. The method of claim 12, wherein the amplifier includes a Gallium Nitride (GaN) amplifier.

14. The method of claim 10, wherein the transmit circuitry includes an antenna array configured to transmit the fundamental frequency and the harmonic frequency simultaneously.

15. At least one non-transitory machine-readable storage device including instructions stored thereon that, when executed by a machine, configure the machine to perform operations comprising:
   determining whether, based on job data stored in a memory and in completing a first job of jobs with a transmission at a fundamental frequency, a harmonic frequency of the transmission satisfies all characteristics of a second job of the jobs, the first job associated with a first device and the second job associated with a different, second device;
   in response to a determination that the harmonic frequency of the fundamental frequency does not satisfy all characteristics of the second job, adjusting a beam width of the fundamental frequency of the signal so that the harmonic frequency of the signal satisfies the second job; and
   producing one or more signals that cause transmit circuitry to transmit the transmission with the fundamental frequency and the harmonic frequency to complete the first and second jobs, respectively and simultaneously.

16. The at least one non-transitory machine-readable storage device of claim 15, wherein the at least one hardware processor is further configured to:
   determine whether adjusting a characteristic of the transmission causes an adjusted harmonic frequency of the transmission to satisfy the second job; and
   in response to a determination that the adjusted harmonic frequency satisfies the second job, adjusting the transmission so that an adjusted harmonic frequency of the adjusted transmission fulfills the second job.

17. The at least one non-transitory machine-readable storage device of claim 15, wherein the memory further includes data indicating a priority for each job of the jobs, and wherein the first job is the job with the highest priority and the second job is a job of lower priority than the first job.

18. The at least one non-transitory machine-readable storage device of claim 15, wherein the operations further include control the transmit circuitry to adjust a direction of a fundamental frequency of the transmission so that the fundamental frequency satisfies the first job and the harmonic frequency satisfies the second job.

* * * * *